United States Patent [19]

Haluska et al.

[11] Patent Number: 4,842,888
[45] Date of Patent: Jun. 27, 1989

[54] CERAMIC COATINGS FROM THE PYROLYSIS IN AMMONIA OF MIXTURES OF SILICATE ESTERS AND OTHER METAL OXIDE PRECURSORS

[75] Inventors: Loren A. Haluska; Keith W. Michael, both of Midland; Leo Tarhay, Sanford, all of Mich.

[73] Assignee: Dow Corning Corporation, Midland, Mich.

[21] Appl. No.: 178,749

[22] Filed: Apr. 7, 1988

[51] Int. Cl.$^4$ ............................................. B05D 3/06
[52] U.S. Cl. .................................. 427/38; 427/126.3; 427/126.4; 427/240; 427/249; 427/380; 427/397.7; 427/419.2; 427/419.7; 427/419.8; 427/421; 427/427; 427/443.2; 428/688; 428/698; 428/704
[58] Field of Search ..................... 427/38, 126.3, 126.4, 427/240, 249, 380, 397.7, 419.2, 419.7, 419.8, 421, 427, 443.2; 428/688, 698, 704

[56] References Cited

U.S. PATENT DOCUMENTS 3,061,587 10/1963 Rust et al. .

OTHER PUBLICATIONS

Gupta & Chin, Microelectronics Processing, Chapter 22, "Characteristics of Spin–On Glass Films as a Planarizing Dielectric", pp. 349–65, American Chemical Society, 1986.

Glasser et al., ("Effect of the H2O/TEOS Ratio Upon the Preparation and Nitridation of Silica Sol/Gel Films", Journal of Non-Crystalline Solids 63, (1984) pp. 209–221).

Brow and Pantano, Journal of the American Ceramic Society, 70(1), pp. 9–14, 1987.

*Primary Examiner*—Bernard Pianalto
*Attorney, Agent, or Firm*—James E. Bittell

[57] ABSTRACT

Hydrolyzed or partially hydrolyzed mixtures of silicate esters and metal oxide precursors, are pyrolyzed at relatively low temperature in the presence of ammonia to form ceramic coatings on substrates such as electronic devices. The metal oxide precursors are soluble compounds, for example alkoxides, of aluminum, titanium, or zirconium. The coatings produced are useful for the protection of electronic devices. One or more coatings containing amorphous silicon, silicon carbon, silicon nitrogen, or silicon carbon nitrogen can be applied over the nitrided ceramic $SiO_2$/metal oxide coating for still further protection of electronic devices.

16 Claims, No Drawings

CERAMIC COATINGS FROM THE PYROLYSIS IN AMMONIA OF MIXTURES OF SILICATE ESTERS AND OTHER METAL OXIDE PRECURSORS

BACKGROUND OF THE INVENTION

This invention relates to ceramic coatings for the protection of the surfaces of substrates such as electronic devices like integrated circuits on semiconductor chips. The invention also relates to ceramic coatings used to form interlevel dielectric films to isolate metallization layers in electronic devices.

A common cause of failure of electronic devices is microcracks or voids in the surface passivation of the semiconductor chip allowing the introduction of impurities. Thus a need exists for improved protective coatings which will resist the formation of microcracks, voids or pinholes even during use in stressful environments.

Passivating coatings on electronic devices can provide barriers against ionic impurities, such as chloride ion (Cl−) and sodium ion (Na+), which can enter an electronic device and disrupt the transmission of electronic signals. The passivating coating can also be applied to electronic devices to provide some protection against moisture and volatile organic chemicals.

It is known to use planarizing interlayers within the body of an electronic device between the metallization layers. Gupta and Chin (Microelectronics Processing, Chapter 22, "Characteristics of Spin-On Glass Films as a Planarizing Dielectric", pp. 349–65, American Chemical Society, 1986) have shown multilevel interconnect systems with isolation of metallization levels by interlevel dielectric insulator layers of doped or undoped $SiO_2$ glass films. Spin-on glass films have been utilized to provide interlayer isolation between the metallization layers, the top layer of which is later patterned by lithographic techniques.

Glasser et al. ("Effort Of The $H_2O$/TEOS Ratio Upon The Preparation And Nitridation Of Silica Sol/Gel Films", Journal of Non-Crystalline Solids 63, (1984) p. 209–221) utilized solutions of hydrolyzed tetraethoxysilane (TEOS) to produce silica sol/gel films which were subsequently subjected to thermal treatment and nitridation in an ammonia atmosphere. Glasser et al. Suggests that the nitrided silica sol/gel films may be useful oxidation barriers for silicon and other metal surfaces.

Brown and Pantano, Journal of the American Ceramic Society, 70(1) pp. 9–14, 1987, discloses the thermochemical nitridation of microporous silica films in ammonia using so-called "sol gels" derived from tetraethoxysilane as the starting material.

Rust et al., U.S. Pat. No. 3,061,587, issued Oct. 30, 1963, teaches a process for forming ordered organo silicon-aluminum oxide copolymers by reacting dialkyl diacyloxysilane or dialkyl dialkoxysilane, with trialkyslsiloxy dialkoxy aluminum.

SUMMARY OF THE INVENTION

The instant invention relates, in one embodiment, to a process for the low temperature formation of single-layer and/or multilayer coatings for the protection of surface features of sensitive substrates such as electronic devices. In a secon embodiment the invention relates to the formation of interlevel dielectric films as used in electronic devices where electronic functions are built up and occur in multiple metallized layers separated electrically by interlevel dielectric films. The coating methods of this invention are especially effective in providing protection for surfaces having irregular features such as a CMOS device having bond pad attachments and an etch pattern.

In the present invention, a method is described for forming a planarizing first layer of a nitrided coating containing silicon dioxide and ziroconium, aluminum, and/or titanium oxide on a substrate surface. The coating of nitrided silicon and other metal oxides provides substantial surface protection as a single-layer and can be used independent of other overcoat layers or can be used as the first layer of a multilayer protective coating system. Alternatively, a nitrided coating of silicon and other metal oxides provides a dielectric film which, after overcoating with a metallization layer, functions as an interlevel dielectric layer.

Nitrided coatings are obtained according to the present invention by first applying a solution containing a mixture of hydrolyzed or partially hydrolyzed silicate ester and metal oxide precursors of zirconium, aluminum, and/or titanium to the surface of a substrate and then heat treating the coating in an ammonia atmosphere to effect conversion to the nitrided coating of silicon dioxide and ziroconium, aluminum, and/or titanium oxides.

The dual-layer coatings of the present invention consist of (1) a first layer of the nitrided planarizing coating as described above, and (2) a second coating layer of silicon, silicon-nitrogen, silicon-carbon, or silicon-carbon-nitrogen ceramic or ceramic-like material as further described hereafter. The second layer is formed over the first coating layer by either of the methods. In one option, the second coating layer is formed by applying a preceramic polymer over the surface of the first layer, typically using a conventional flow coating technique with the preceramic polymer dissolved in a solvent which subsequently evaporates. The polymer coating is then converted to a ceramic or ceramic-like layer by a subsequent heat treatment. Alternatively, the second layer can be a silicon, silicon-nitrogen, silicon-carbon-nitrogen, or silicon-carbon ceramic layer deposited directly by a chemical vapor deposition process.

The instant invention also relates to the formation of a three layer coating system for the protection of electronic devices wherein the first layer is the nitrided planarizing coating as described above and the second layer is any of the ceramic coatings described above.

The third layer in the three layer coatings of the present invention is a top coating of (a) amorphous silicon material applied by CVD, PECVD, or metal assisted CVD of a silane, halosilane, halodisilane, polyhalosilane, or mixtures thereof, or (b) silicon-carbon ceramic material, applied by CVD or plasma enhanced CVD of a silane, halosilane, halodisilane, polyhalosilane, or mixtures thereof, and an alkene of one to six carbon atoms, or an alkylsilane, or (ce silicon-nitrogen ceramic material applied by CVD or plasma enhanced CVD of a silane, halosilane, halodisilane, polyhalosilane, or mixtures thereof, and ammonia, or (d) silicon-carbon-nitrogen ceramic material applied by CVD or plasma enhanced CVD of hexamethyldisilazane or CVD or plasma enhanced CVD of a mixture of silane, alkane and ammonia or a mixture of alkylsilane and ammonia.

DETAILED DESCRIPTION OF THE INVENTION

The instant invention relates to the discovery that nitrided ceramic coatings can be applied onto substrates, including, but not limited to, electronic devices and integrated circuits, to provide protection of the substrates from the environment. The nitrided ceramic coatings are prepared by ceramification preferably at low temperatures, in an ammonia atmosphere, of solvent-applied films containing a mixture of hydrolyzed or partially hydrolyzed silicate ester and metal oxide precursors of zirconium, aluminum, and/or titanium.

In the instant invention, the term "ceramic" is intended to designate both conventional ceramic materials and othe heat treated or pryolyzed materials which have been substantially altered in chemical composition and physical characteristics by the heat treaatment, but which may not be fully free of residual hydrogen and/or other elements representative of the materials preceramic structure. The term "electronic device" in the instant invention is intended to include, but not be limited to, electronic devices, silicon based devices, gallium arsenide devices, focal plane arrays, opto-electronic devices, photovoltaic cells, optical devices, transistor-like devices, multilayer devices, 3-D devices, silicon-on-insulator (SOI) devices, super lattice devices and the like.

The phrase "flowable solution" in the present invention should be understood to mean flowable, extrudable or pourable organic solvent solutions of mixtures comprising hydrolyzed or partially hydrolyzed silicate ester and a metal oxide precursor selected from the group consisting of acyloxy and alkoxy compounds of aluminum, titanium and ziroconium. The term "cure" in the present invention is intended to mean co-reaction and ceramification or partial ceramification of the starting material by heating to such an extent that a solid ceramic coating material is produced.

The phrase "nitrided coating" in the present invention is intended to mean metal and oxygen containing films or layers which films or layers further contain therein nitrogen. Nitrogen incorporation was found to occur in the process of the present invention. Thus, silicon oxynitrides are envisioned as possible materials to be found within the scope of the "nitrided coating" materials discussed herein.

The instant invention relates to enhanced protection of substrates such as electronic devices by the low temperature formation of thin single-layer or multilayer ceramic coatings on the surface of the substrates. According to the present invention, the substrate is first coated with a solution of a product formed by mixing hydrolyzed or partially hydrolyzed silicate ester and a metal oxide precursor. Silicate esters are organic orthosilicates and include the alkyl orthosilicates such as methyl orthosilicate, ethyl orthosilicate, butyl orthosilicate, and octyl orthosilicate. Generally alkyl orthosilicates having alkyl groups of 1 to 10 carbon atoms are preferred for preparing the coating compositions. Ethyl orthosilicate is especially preferred because of its ready availability, but any silicate esther can be used which can be hydrolyzed to prepare soluble silicate gels or resins.

The silicate ester is hydrolyzed or partially hydrolyzed by addition of water to a solution of the silicate ester in an organic solvent. Genrally a small amount of an acid or basic compound is used to facilitatie the hydrolysis reeaction. Suitable organic solvents include, but are not limited to alcohols such as ethanol, isopropanol, and butanol; ethers such as tetrahydrofuran, diethylether, and methyl celosolve; and ketones such as acetone and methylethyl ketone. The silicate ester may be hydrolyzed prior to mixing with metal oxide precursor or it may be hydrolyzed subsequent to mixing with metal oxide precursors. In cases where more reactive metal oxide precursors such as zirconium tetraacetyacetonate are employed, it is preferred to first mix the metal oxide precursor and silicate ester and then reflux the mixture until homogeneous prior to addition of water. Such pre-action allows more uniform and controlable hydrolysis and provides a more homogeneous coating solution.

Non-homogeneous gellation often results if a mixture of a highly reactive metal oxide precursors and a silicate ester is hydrolyzed without the pre-reaction step. For the purposes of this invention, it is only necessary by one sequence or the other to obtain a homogeneous solution of a hydrolyzed or partially hydrolyzed mixture of silicate ester and metal oxide precursor.

The metal oxide precursors are combined with silicate ester or hydrolyzed silicate ester in sufficient organic solvent to prepare flowable solutions for coating the substrates. A single metal oxide precursor may be combined with the silicate ester or hydrolyzed silicate ester or mixtures of two or three metal oxide precursors may be combined with the ester. For the purposes of this invention, metal oxide precursors are compounds of aluminum, ziroconium, or titanium which are soluble in organic solvents. Such soluble metal compounds include alkoxy and acyloxy compounds of aluminum, zirconium, and titanium.

Depending on the valance of the metal, the soluble metal compounds may have up to four alkoxy or acyloxy groups bonded to the metal. For the purposes of this invention it is only necessary that the metal compound have a number of acyloxy or alkoxy groups such that the compound is sufficiently soluble in an organic solvent. The selection of specific acyloxy or alkoxy groups is not critical since the groups are fugitive in the sense that they are either ultimately hydrolyzed or pyrolyzed during the ceramifying heat treatment that converts the coating components to nitrided metal oxides. Typical acyloxy and alkoxy groups include, for example, isobutoxy, isopropoxy, acetylacetonate, n-propoxy, stearate, propanoate, and hexoxy. Useful metal oxide precursors include, for example, tetraacetylacetonate zirconium, $Zr(OC(CH_3)=CHC(O)CH_3)_4$, dibutoxydiacetylacetonate titanium, $Ti(OC_4H_9)_2(OC(CH_3)=CHC(O)CH_3)_2$,
aluminum triacetylacetonate, $Al(OC(CH_3)=CHC(O)CH_3)_3$,
and tetraisobutoxy titanium, $Ti(OCH_2CH(CH_3)_2)_4$.

Generally, metal oxide precursors are combined with silicate ester or hydrolyzed silicate ester in proportions such that, after the ceramifications, the combined content of metal oxides of aluminum, zirconium, and/or titanium will vary from about 0.1 to about 30 percent by weight of the ceramic residue. It should be understood that specific proportions of metal oxide precursors appropriate to provide a given level of aluminum, zirconium, and/or titanium oxide in the final ceramic coating will vary depending on the size of the acyloxy and/or alkoxy groups present in the metal oxide precursor compound. Appropriate proportions can generally be determined by calculations based on the equivalents of aluminum, zirconium, and/or titanium oxide represented by the precursor compound and the corresponding equivalents of silicon dioxide represented by the silicate ester.

Exemplary formulations of the instant invention of planarizing coatings pyrolyzed in ammonia include, but are not limited to, those depicted in Table I.

TABLE I

Composition of Some Planarizing Coatings of the Instant Invention

| Sample No. | $SiO_2$ wt. % | $ZrO_2$ wt. % | $TiO_2$ wt. % | $Al_2O_3$ wt. % |
|---|---|---|---|---|
| 1 | 90 | 10 | | |
| 2 | 90 | | 10 | |
| 3 | 74.7 | | | 25.3 |
| 4 | 80 | 10 | 10 | |
| 5 | 70 | 10 | 10 | 10 |
| 6 | 80 | | 20 | |
| 7 | 70 | | 30 | |
| 8 | 80 | 20 | | |
| 9 | 70 | 30 | | |
| 10 | 70 | | | 30 | wt % is weight percent

The hydrolyzed mixture of silicate ester and metal oxide precursor is diluted in a solvent to facilitate coating the substrate. It is generally preferred to dilute the mixture with a solvent such as ethanol or methyl ethyl ketone to about 0.1 to about 90 percent solids by weight. The solution is coated onto substrates such as electronic devices and the solvent allowed to evaporate by drying at ambient or elevated temperatures. The processes for coating the mixture onto substrates such as electronic devices include, but are not limited to, spin coating, dip coating, spray coating, or flow coating with spin coating usually preferred.

The preceramic coating is then cured and ceramified by heating the coated device, for example, for approximately one hour at 400° C. in an ammonia atmosphere. Generally, it is preferred to effect the heat treatment in an atmosphere of anhydrous ammonia that is essentially free of other components. The use of such an atmosphere improves the effectiveness of the ammonia and extent of nitridation that is obtained at a given temperature and time of treatment. It should be understood however that lesser amounts of ammonia such as less than atmospheric pressures of ammonia or mixtures of ammonia and other noninterfering gaseous components can be used in the process of the present invention. Of course, pressures of ammonia above atmospheric may also be used so long as the ammonia remains in the gaseous state. Any gaseous atmosphere containing sufficient ammonia to effect nitridation of the coating during the heat treatment can be used in the present invention. For the purposes of this invention an atmosphere containing sufficient ammonia to effect nitridation during heat treatment will be referred to as a "substantially ammonia" atmosphere.

Continuous, crack-free films of nitrided metal oxide ceramic are formed on the surface of substrates of the procedures of this invention. The films can be formed up to about 2 microns thickness without observable cracks or defects. Typically, it is preferred when coating electronic circuits to use films of about 0.3 to 0.5 microns thickness. Such films are preferred because they minimize the possibility of cracking and defects resulting from thermal stresses, but have sufficient thickness to provide substantial planarizing or smoothing of the irregular features on the surface of electronic circuits. This smoothing or planarizing effect is needed so that subsequent coatings of other components can be applied which are not typically useful on highly irregular surfaces. The smoothing effect of this layer tends to minimize the mechanical stresses caused by irregular topography often found on the surface of such substrates as integrated circuit devices. By minimizing such stresses, microcracking of a subsequently applied passivation coating layer is reduced or eliminated under thermal cycling conditions and the life of the integrated circuit device is increased.

An important feature of the present invention is the utilization of ammonia in the pyrolytic elimination of SiOH, SiOR, and MOR during the heat treatment of preceramic coatings, where R denotes an alkyl group and M denotes Ti, Al, or Zr. This heat treatment in an ammonia atmosphere produces coatings containing substantially reduced amounts of residual MOR, SiOR, and SiOH. The addition of ammonia is believed to create an atmosphere more reactive than air toward the pyrolytic elimination of SiOR, MOR, and SiOH.

Furthermore, by pyrolyzing the coating in ammonia, nitrogen is incorporated into the ceramic or ceramic-like metal oxide coating. The nitridation in the process of the present invention resulted in approximately 1 to 2 weight percent nitrogen incorporation. It is believed that nitrogen incorporation may result from formation of silicon oxynitride as a component of the coating.

An advantage of the process of the present invention over the state-of-the-art processes is the ability of the hydrolyzed mixtures of silicate esters and metal oxided precursors to be cured by heat treatment in the presence of ammonia at temperatures as low as 200° to about 400° C. This temperature range is significantly lower than that of the prior art. Thus in its broadcast embodiment, the process of the present invention is the pyrolysis of a coating of hydrolyzed mixtures of silicate esters and metal oxide precursors in an ammonia atmosphere at a temperature between 200° and 1000° C. But in a much more preferred embodiment, the process of the present invention is the pyrolysis of such coatings in an ammonia atmosphere at a temperature in the range from 200° up to and including about 400° C.

The present invention further relates to a process for forming on a substrate a ceramic coating which process comprises (A) applying to the substrate a flowable solution of a composition comprising a hydrolyzed or partially hydrolyzed mixture of a silicate ester and a metal oxide precursor selected from the group consisting of acyloxy and alkoxy compounds of aluminum, titanium, and zirconium wherein the proportion by weight of metal oxide precursor as metal oxide is about 0.1 to about 30 percent; (B) drying the solution to deposit a preceramic coating on the substrate; and (C) heating the coated substrate in a substantially ammonia atmosphere to a temperature sufficient to produce a ceramic coating on the substrate.

The instant invention further relates to the discovery that these nitrided metal oxide ceramic coatings can be coated with various silicon, silicon-carbon, silicon-nitrogen, or silicon-carbon-nitrogen containing materials for the still further protection of sensitive substrates such as electronic devices or integrated circuits. Correspondingly, the instant invention also relates to a process for forming on a substrate a multilayer, ceramic coating which process comprises applying a second passivating coating to a substrate previously coated with the ceramified mixture of hydrolyzed silicate ester and metal oxide precursor. The passivation layer prevents ionic impurities from entering the electronic field of coated substrates such as an integrated circuit device.

The passivating coating may comprise, for example, a ceramic film produced by diluting a preceramic polymer in a solvent, coating the device with the diluted preceramic polymer solution, drying the diluted preceramic polymer solution so as to evaporate the solvent and thereby deposit a coating of the preceramic polymer on the device, and heating the coated device in an inert ceramify the second coating on the device.

Any preceramic polymer can be used to prepare a passivating layer as described above so long as the polymer can be dissolved in a solvent suitable for use as a coating medium. Suitable preceramic polymers include, for example, polymers which are known precursors for silicon-carbide ceramic material such as polycarbosilanes and organopolysilances. The polycarbosilanes can be prepared by thermolysis of polydimethylsilanes, thermolysis of organosilane monomers, or potassium-dechlorination of chloromethyl- or vinylsilanes with other methylchlorosilanes. The polycarbosilanes and their preparations are further described in U.S. Pat. Nos. 4,052,430, 4,414,403, 4,497,787, and 4,472,591 and Ger. Offen. 2,236,078 which are hereby incorporated by reference. The organopolysilanes can be prepared by sodium-dechlorination of di(mixed-organo)dichlorosilanes or by redistribution of methylchlorodisilanes. The organopolysilanes, various derivatives of organopolysilanes, and preparations are further described in U.S. Pat. Nos. 4,260,780, 4,324,901, 3,310,651, 4,310,482, 4,298,559, 4,546,163, 4,298,558, 4,310,481, and 4,314,956 which are hereby incorporated by reference.

Other suitable preceramic polymers include, for example, polymers which are known precursors for silicon-nitride ceramic material such as polysilazanes prepared by ammonolysis of dichlorosilane as described by Seyferth et al. in U.S. Pat. No. 4,397,828 which is hereby incorporated by reference.

Still other suitable preceramic polymers include, for example, polymers which are known precursors for silicon-carbon-nitrogen ceramic material such as silsesquiazanes and carbon substituted polysilazanes. Silsesquiazanes can be prepared by ammonolysis of organotrichlorosilane, aminolysis of $CH_3SiCl_3$ and $SiCl_4$, and silaznolysis of $CH_3SiCl_3$ and $HSiCl_3$. Carbon substituted polysilazanes can be prepared by ammonolysis of $CH_3HSiCl_2$ or methylchlorodisilanes, by aminolysis of $H_2SiCl_2$, by thermal redistribution of methylchlordisilanes with mexamethyldisilazane, or by thermal redistribution of trichlorosilane with hexaorganodisilazane or cyclic organosilazanes. The silsesquiazanes and carbon substituted polysilazanes are known materials which are further described in U.S. Pat. Nos. 3,892,583, 3,853,567, 4,312,970, 4,482,669 4,395,460, 4,340,619, 4,482,689, 4,543,344, and 4,540,803 which are hereby incorporated by reference.

Polysilacyclobutasilazanes are also useful as ceramic precursor polymers for formation of a passivation coating layer. Polysylacyclobutasilazanes are prepared by reacting 1,1-dichlor-1-silacyclobutane with a difunctional nucleophile such as ammonia, hydrazine, or a diamine. An especially preferred polymer is prepared by reacting 1,1-dichloro-1-silacyclobutane with ethylenediamine in methylene chloride (solvent) in the presence of triethylamine (acid acceptor).

The formation of a passivating coating layer is specifically exemplified as follows for a preferred embodiment wherein a polysilazane prepared by the method described in U.S. Pat. No. 4,540,803 is used as the precursor for formation of a silicon-carbon-nitrogen ceramic layer. The preceramic polymer is diluted (eg., 0.1 to 50 weight %) in an organic solvent such as toluene or n-heptane. The polymer solution is coated (by any convenient method such as spin coating) onto an electronic device over the previously applied planarizing coating. The solvent is allowed to evaporate by drying in an inert or ammonia containing atmosphere. The preceramic polymer coating is then ceramified by heating the coated device for approximately one hour at temperatures up to 400° C. under argon. This ceramic passivating coatings of less than 2 microns (preferably approximately 0.3 to 0.5 microns) are thus produced on devices.

The preferred temperature range for ceramifying or partially ceramifying a preceramic polymer is from 200° to 400° C. A more preferred temperature range for ceramifying a preceramic polymer is from 300° to 400° C. The method of applying the heat for the ceramification or partial ceramification of the preceramic coating is not limited to conventional thermal methods. Also, the present invention is not limited to ceramification temperatures below 400° C. Ceramification techniques utilizing temperatures up to and including at least 1000° C. will be obvious to those skilled in the art, and are useful in the present invention where the substrate can withstand such temperatures.

The second or passivating coating may also comprise a CVD or PECVD applied silicon containing coating, silicon-carbon containing coating, silicon-nitrogen containing coating or silicon-carbon-nitrogen containing coating, or a combination of these coatings. A material composed primarily of silicon can be deposited by the CVD or plasma enhanced CVD of silane, halosilanes, polyhalosilanes, or halodisilanes. Silicon-nitrogen containing material can be deposited by the CVD or plasma enhanced CVD of a silazane or cyclosilazane $(H_2SiNH)_x$, by the CVD or plasma enhanced CVD of either carbosilazane or polysilacyclobutasilazane combined with ammonia, or by the CVD or plasma enhanced CVD of the products formed by reacting either silane, halosilanes, polyhalosilanes, or halodisilanes with ammonia. Silicon-carbon containing material can be deposited by the CVD or plasma enhanced CVD of the products formed by reacting either silane, halosilanes, polyhalosilanes, or halodisilanes with an alkane of one to six carbon atoms. Silicon-carbon-nitrogen containing material can be deposited by the CVD or PECVD of either hexamethyldisilazane or carbosilazane in an ammonia atmosphere, by the CVD or PECVD of cyclosilazane, silazanes, or the CVD or PECVD of mixtures of either a silane or an alkylsilane with an alkane of one to six carbon atoms, and ammonia.

For the still further protection of sensitive substrates such as electronic devices or integrated circuits, it may also be advantageous to apply a barrier coating over the top of the planarizing and/or passivating coating layers of this invention. The barrier coating layer is intended to hermetically seal the substrate surface from all external influences including any form of water, organic vapor, and ionic impurities. Preferred components for use in fashioning the barrier layer include dense amorphous silicon, silicon carbide, silicon nitride, and silicon-carbon-nitrogen ceramic materials, with dense amorphous silicon being most preferred.

The barrier coating is generally applied by a CVD or plasma enhanced CVD process. Barrier coatings can be applied by any of the CVD or plasma enhanced CVD processes previously described above for application of the passivation coating layer. However, it is preferred to form a silicon containing third layer or topcoat at a relatively low reaction temperature by the metal-assisted CVD process claimed in the co-pending U.S. Pat. application, Ser. No. 835,029, mentioned supra. The metal assisted CVD processes is particularly suited for the deposition of coatings from $SiCl_4$, $SiBr_4$, $HSiI_3$, $HSiCl_3$, and $HSiBr_3$.

Single layer or multilayer coatings produced by the instant invention possess low defect density and are useful on electronic devices as protective coatings, as corrosion resistant and abrasion resistant coatings, as temperature and moisture resistant coatings, and as a diffusion barrier against ionic impurities such as $Na^+$ and $Cl^-$. The coatings of the present invention are also useful for functional purposes in addition to coatings of the present invention are useful, for example, as inter-level dielectric layers, multilayer devices, 3-D devices, compact discs, optical discs, optically readable devices and surfaces, silicon-on-insulator (SOI) devices, super-conduting devices, and super lattice devices. More specifically, ceramic coatings of nitrided mixtures of silicon oxide and aluminum, ziroconium, and/or titanium oxides are useful as interlevel dielectrics within the body of the electronic device and between the metallization layers.

Another unique aspect of the coatings produced by the present invention is their transparency to electromagnetic radiation. Thus a particular advantage of the coatings of the present invention is utilization on focal plane arrays, photovoltaic cells, or opto-electronic devices in which electromagnetic radiation can pass into or emanate from the coated device.

It should be understood that for final package stability and improved handling, a final coating of an organic polymer or organometabilic polymer may be applied to electronic devices containing the protective coatings of this inventionl. Any of the organic polymer or organometalic polymers previously used for packaging electronic devices can be used for packaging devices containing the protective coating of this invention. Such packaging coatings are generally applied in relatively thick (>2 microns, typically 20–50 mils) layers. Either thermoset or thermoplastic polymers such as for example, polybenzocyclobutane, epoxy resins, polymide resins, organosiloxane resins, polyphenylene sulfide resins, copolymers of organosiloxanes and polyamides, copolymers or organosiloxane and epoxy resins, copolymers of organosiloxane and polybenzocyclobutane, polyester resins, copolymers of organosiloxanes and polyesters, polyphosphazene, polytetrafluoroethylene, polyethylene, and polypropylene can be used for application of packaging coatings.

Packaging coatings may be applied to electronic devices of this invention by any of the methods known for packaging conventional electronic devices. For example, coatings can be applied by molding processes or solution coating methods such as spin, spray, dip, screen, or flow. Electronic devices containing one or more of the protective coating layers of this invention and an overcoat of organic or organometalic polymer have improved reliability relative to devices coated only with an organic or organometalic polymer because the coatings of this invention provide protection of the electronic device from any corrosive gases released at elevated temperatures from the organic or organometalic polymer coatings.

The following examples are presented to illustrate the invention to those skilled in the art and should not be construed as limiting the invention, which is properly delineated in the appended claims. All proportions by parts or percents are by weight unless otherwise stated.

EXAMPLE 1. CERAMIFICATION OF $SiO_2/ZrO_2$ (90:10) IN AMMONIA

A mixture of 0.3125 g of ethyl orthosilicate and 0.0396 g of zirconium tetraacetylacetonate, was dissolved in 35.2 g of ethanol and refluxed for 24 hr. The mixture was then cooled to room temperature. A 5 g portion of the mixture was combined with 0.033 g of water and one drop of 5% aqueous HCl. This solution was heated to 60–75° C. for 45 minutes to produce a hydrolyzed preceramic polymer solution. Five drops of the solution was spin coated for 1 min at about 1150 rpm onto a Motorola 14011B CMOS electronic device.

A 2 inch Lindberg furnace was flushed with anhydrous ammonia for 20 minutes to provide an ammonia atmosphere essentially free of othe components. The deposited coating was ceramified by heating in the ammonia atmosphere in the furnace for 1 hr at 400° C. A thin planarizing nitrided ceramic $SiO_2/ZrO_2$ coating was produced on the devices.

Examination of the coated devices at $44\times$ magnification showed the coating to be of good optical quality with no coating cracks or defects. Coatings were also applied to aluminum panels by this method.

EXAMPLE 2. CERAMIFICATION OF $SiO_2/TiO_2$ IN AMMONIA

A solution of 8.6 ml of ethyl orthosilicate, 8.6 ml of ethanol, 2.8 ml of water and 1 drop of 5% aqueous HCl was heated at 60° C. for 30 minutes. The solution was diluted with 60 ml of ethanol. A 1.8 g portion of the silicate solution was mixed with 8.2 g of ethanol and 0.04 g of dibutoxy diacetylacetonate titanium, $Ti(OC_4H_9)_2(O_2C_5H_7)_2$, and allowed to stand at room temperature for 24 hr prior to use.

The silicate/titanium solution (5 drops) was spin coated for 30 sec at 1695 rpm onto an electronic device and the solvent allowed to evaporate. The deposited coating was ceramified by heating in ammonia for 1 hr at 400° C. A thin nitrided ceramic $SiO_2/TiO_2$ planarizing coating was produced on the device. Coatings were also applied to aluminum panels by this method.

EXAMPLE 3. CERAMIFICATION OF $SiO_2/Al_2O_3$ IN AMMONIA

A solution of 5.04 ml of ethyl orthosilicate, 5.04 ml of ethanol, 9.9 ml of water and two drops of 5% aqueous HCl was heated at 60–70° C. for 30 min. The solution was diluted to 3.3% solids by the addition of 60 ml of ethanol followed by the addition of 1 drop of 5% aqueous HCl. The solution was allowed to stand at room temperature for 4 days. A 10 g portion of the solution was mixed with 0.235 g of aluminum trispentanedionate and 26.2 g of ethanol to produce a clear, stable preceramic polymer solution.

A Motorola 14011B electronic CMOS device was spin coated for 30 sec at 1695 rpm with 5 drops of the preceramic polymer solution. After evaporation of solvent, the deposited coating was ceramified by heating in ammonia for one hour at 400° C. A thin nitrided ceramic $SiO_2/Al_2O_3$ planarizing coating was produced on the device. Coatings were also applied to aluminum panels by this method.

EXAMPLE 4. $SiO_2/ZrO_2/TiO_2/Al_2O_3$ (70:10:10:10)

A solution of 0.729 g of ethyl orthosilicate, 0.098 g of titanium dibutoxy diacetylacetonate, 0.119 g of zirconium tetraacetylacetonate, and 0.180 g of aluminum triacetylacetonate in 28.9 g of ethanol was refluxed for 24 hr. A 29 g portion of the solution was hydrolyzed by adding 0.12 g of water and 0.015 g of 5% aqueous HCl and heating the solution to 60–75° C. for 30 min.

A Motorola 14011B electronic CMOS device was spin coated for 30 sec at 1695 rpm with 5 drops of the preceramic polymer solution. After evaporation of solvent, the deposited coating was ceramified by heaating in ammonia for one hour at 400° C. A thin nitrided ceramic $SiO_2/Al_2O_3/ZrO_2/TiO_2$ planarizing coating was produced on the devices. Coatings were also applied to aluminum panels by this method.

EXAMPLE 5

A solution of 8.03 g of ethyl orthosilicate in 6.78 g of 2-methoxyethanol was hydrolyzed by adding 5.1 g of water and 1 drop of 5% aqueous HCl and heating at 60–80° C. for 30 min. A 7.62 g portion of the solution was mixed with 1.08 g of aluminum triacetylacetonate and 10 g of methyl ethyl ketone. A clear, homogeneous coating solution resulted. A portion of the solution was allowed to evaporate to dryness overnight to obtain a sample of bulk solids repesentative of the preceramic coating material. The solids were crushed to a fine powder using a spatula.

A 0.553 g portion of the preceramic solids was heated in an ammonia atmosphere as described in Example 1, at 400° C. for 1 hr. A ceramic char of 0.292 g was obtained. Analysis of the ceramic char indicated 3.79% C, 0.4% H, and 1.36% N.

A 0.561 g portion of the preceramic solids was heated in an atmosphere of air in a 12 inch Lindberg furnace at 400° C. for 1 hr. A ceramic char of 0.306 g was obtained. Analysis of the ceramic char indicated 6.79% C, about 0.1% H, and <0.1% N or essentially no nitrogen detected.

Two Motorola 14011B electronic CMOS device were spin coated for 15 sec at 5000 rpm with 5 drops of the above coating solution. After evaporation of solvent, the deposited coatings were ceramified by heating the devices in an ammonia atmosphere for one hour at 400° C.

A second coating layer was applied to the devices by spin (5000 rpm) coating a 5% solution in toluene of a preceramic polysilazane polymer. The polysilazane polymer was prepared by reacting $HSiCl_3$ and hexamethyldisilazane followed by neutralization with ammonia according to the procedure described in Example 1 in U.S. Pat. No. 4,540,803. After the solvent was evaporated the devices were heated to 400° C. in an ammonia atmosphere for 2 hr to ceramify the coatings. Examination of the coated devices at 15× magnification showed the coating layers to be of good optical quality with no visible cracks or defects. The devices were found to be fully functional when tested according to the go/no go test on a Teradyne Analogical Circuit Test Instrument J133C equipped with a CMOS 4000 AE Series Family Board and a CMOS 4011 A Quad 2 Input Nand Gate Device Board.

EXAMPLE 6. CERAMIFICATION OF A TITANIUM-CONTAINING SILAZANE POLYMER PASSIVATING COATING

If a preceramic silazane polymer containing about 5% titanium, prepared by the method of Haluska in Example 13 in U.S. Pat. No. 4,482,689, is diluted to 1.0% in toluene, it can be spin coated onto the nitrided $SiO_2$/metal oxide coated electronic devices produced by the methods of Examples 1 to 4. The solvent should be allowed to evaporate. The deposited coating can be ceramified by heating the coated device for about 1 hr at temperatures up to 400° C. under nitrogen. Thin silicon-nitrogen-titanium ceramic coatings will be produced on the coated devices.

EXAMPLE 7. CERAMIFICATION OF SILAZANE POLYMER PASSIVATING COATING

If a preceramic silazane polymer, prepared by the method of Gaul in Example 1 in U.S. Pat. No. 4,395,460, is diluted to 1.0% in toluene, it can be coated onto a nitrided $SiO_2$/metal oxide coated electronic device. The solvent should be allowed to evaporate. The deposited coating can be ceramified by heating the coated device for about 1 hr at temperatures up to 400° C. under argon. Thin silicon-nitrogen ceramic coatings will be produced on the devices.

EXAMPLE 8. CERAMIFICATION OF A DIHYDRIDOSILAZANE POLYMER PASSIVATING COATING

A 1–2% solution in diethyl ether of dihydridosilazane polymer, prepared by the method of Seyferth in Example 1 in U.S. Pat. No. 4,397,828, can be flow coated onto Motorola 14011B CMOS electronic devices previously coated by the methods of Examples 1–4, above. The coating and pyrolysis treatment will not adversely affect the function of the devices, as determined by a CMOS circuit tester. The coated devices will withstand 0.1M NaCl exposure for over four hours before circuit failure. A non-protected CMOS device will fail to function after exposure to a 0.1M NaCl solution for less than 1 min.

EXAMPLE 9. CVD BARRIER COAT FROM $F_3SiSiF_3$.

Electronic devices coated with the planarizing and/or passivating coatings of Examples 1 through 8 can be overcoated with barrier coats as follows; hexafluorodisilane, 50 Torr, can be placed in a previously evacuated glass container along with a Motorola 14011B CMOS electronic device, previously coated as in Examples 1–8, above. The hexafluorodisilane should be transferred to the glass container in such a manner as to preclude exposure to the atmosphere. The container should be heated in an oven for 30 min at a temperature of about 360° C. During this time the hexafluorodisilane decomposes and forms a topcoat containing silicon on the electronic device. The by-products, mixtures of various halosilanes, and any unreacted starting material can be removed by evacuation after the container has been reattached to a vacuum line. The electronic device will pass the Teradyne CMOS test described in Example 5.

That which is claimed is:

1. A process for forming on a substrate a ceramic coating which process comprises:
   (A) applying to the substrate a flowable solution of a composition comprising a hydrolyzed or partially hydrolyzed mixture of a silicate ester and a metal oxide precursor selected from the group consisting of acyloxy and alkoxy compounds of aluminum, titanium, and zirconium wherein the proportion by weight of metal oxide precursor as metal oxide is abouut 0.1 to about 30 percent;
   (B) drying the solution to deposit a preceramic coating on the substrate; and
   (C) heating the coated substrate in a substantially ammonia atmosphere to a temperature of 200° to 100° C. to produce a nitrided ceramic coating on the substrate.

2. A process as claimed in claim 1 wherein the coated substrate is heated to a temperature of 200° to 400° C.

3. A process as claimed in claim 2 wherein the substrate is an electronic device.

4. A process as claimed in claim 3 wherein a method of applying the flowable solution onto the electronic device is selected from the group consisting of spray coating, dip coating, flow coating, and spin coating.

5. A process as claimed in claim 4 wherein the flowable solution contains 90 to 99.9 percent by weight of solvent and 0.1 to 10 percent by weight of the composition comprising a hydrolyzed or partially hydrolyzed mixture of a silicate ester and a metal oxide precursor.

6. A process as claimed in claim 3 further comprising: (D) applying to the ceramic coating a passivating coating selected from the group consisting of (i) a silicon coating, (ii) a silicon carbon coating, (iii) a silicon-nitrogen coating, and (iv) a silicon-carbon-nitrogen coating, wherein the passivating coating is applied by a means selected from the group consisting of (a) chemical vapor deposition, (b) plasma enhanced chemical vapor deposition, and (c) application of a preceramic polymer coating and subsequent ceramification of the preceramic polymer coating.

7. A process as claimed in claim 6 further comprising: (E) applying to the passivating coating a barrier coating selected from the group consisting of (i) a silicon coating, (ii) a silicon carbon coating, (iii) a silicon-nitrogen coating, and (iv) a silicon-carbon-nitrogen coating, wherein the barrier coating is applied by a means selected from the group consisting of (a) chemical vapor deposition and (b) plasma enhanced chemical vapor deposition.

8. A process as claimed in claim 7 wherein the barrier coating is applied by means of metal assisted chemical vapor deposition.

9. An electronic device coated by the process of claim 7.

10. A process as claimed in claim 6 wherein the passivating coating is applied by means of metal assisted chemical vapor deposition.

11. An electronic device coated by the process of claim 6.

12. An electronic device coated by the process of claim 3.

13. A substrate coated by the process of claim 2.

14. A process as claimed in claim 1 wherein the silicate ester is an alkyl orthosilicate having alkyl groups of 1 to 10 carbon atoms.

15. A process as claimed in claim 14 wherein the acyloxy and alkoxy groups of the compounds of aluminum, titanium, and zirconium contain 1 to 18 carbon atoms.

16. A substrate coated by the process of claim 1.

* * * * *

UNITED STATES PATENT AND TRADEMARK OFFICE
CERTIFICATE OF CORRECTION

PATENT NO. : 4,842,888
DATED : JUNE 27, 1989
INVENTOR(S) : LOREN A. HALUSKA, KEITH W. MICHAEL, & LEO TARHAY

It is certified that error appears in the above-indentified patent and that said Letters Patent is hereby corrected as shown below:

COLUMN 13, LINE 15: CHANGE 100° C to 1000° C.

Signed and Sealed this

Second Day of August, 1994

Attest:

BRUCE LEHMAN

Attesting Officer      Commissioner of Patents and Trademarks